(12) United States Patent
Kim

(10) Patent No.: US 11,600,672 B2
(45) Date of Patent: Mar. 7, 2023

(54) ORGANIC LIGHT EMITTING DISPLAY DEVICE

(71) Applicant: LG DISPLAY CO., LTD., Seoul (KR)

(72) Inventor: Hyunseung Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/542,581

(22) Filed: Dec. 6, 2021

(65) Prior Publication Data

US 2022/0208894 A1 Jun. 30, 2022

(30) Foreign Application Priority Data

Dec. 24, 2020 (KR) ........................ 10-2020-0183755

(51) Int. Cl.
*H01L 27/32* (2006.01)
*G02F 1/13363* (2006.01)
*G02F 1/1343* (2006.01)
*G02F 1/13* (2006.01)

(52) U.S. Cl.
CPC ........ *H01L 27/3232* (2013.01); *G02F 1/1323* (2013.01); *G02F 1/133638* (2021.01); *G02F 1/134345* (2021.01)

(58) Field of Classification Search
CPC ............. G02F 1/1323; G02F 1/133707; H01L 27/3232; H01L 27/3244
See application file for complete search history.

(56) References Cited

U.S. PATENT DOCUMENTS

| 10,298,915 B2 | 5/2019 | Huh et al. | |
|---|---|---|---|
| 10,630,964 B2 | 4/2020 | Huh et al. | |
| 2005/0287392 A1* | 12/2005 | Toyoda | H01L 51/56 428/917 |
| 2009/0033596 A1* | 2/2009 | Yoon | H01L 27/3232 345/76 |
| 2011/0096250 A1* | 4/2011 | Cha | H04N 13/305 977/932 |
| 2016/0202490 A1* | 7/2016 | Jung | G02F 1/29 349/123 |
| 2020/0075895 A1* | 3/2020 | Oh | H01L 51/5281 |

FOREIGN PATENT DOCUMENTS

| DE | 102015012271 A1 * | 4/2017 | G02F 1/1323 |
|---|---|---|---|
| KR | 10-2018-0046985 A | 5/2018 | |

\* cited by examiner

*Primary Examiner* — Alexander P Gross
(74) *Attorney, Agent, or Firm* — Polsinelli PC

(57) ABSTRACT

A display device includes a viewing angle control layer including a liquid crystal layer disposed on a second electrode of an organic light-emitting element and the control electrode disposed on the liquid crystal layer, the control electrode includes a plate electrode and a plurality of tip electrodes protruding from the plate electrode toward the second electrode, wherein the plurality of tip electrodes are arranged within a light-emitting area of the organic light-emitting element, and the liquid crystal layer includes positive c-plate liquid crystal molecules aligned vertically.

20 Claims, 7 Drawing Sheets

ORGANIC LIGHT EMITTING DISPLAY DEVICE

CROSS-REFERENCE TO RELATED APPLICATION

This application claims the priority under 35 U.S.C. § 119(a) of Korean Patent Application No. 10-2020-0183755 filed on Dec. 24, 2020, which is hereby incorporated by reference in its entirety for all purposes.

BACKGROUND

Field of the Disclosure

The present disclosure relates to an organic light-emitting display device, and, more specifically, to an organic light-emitting display device that can actively control a viewing angle thereof.

Description of the Background

A display device that displays various information as an image may render an image using various schemes. For example, the display device may include a plasma display panel based display device (PDP), a liquid crystal display device (LCD), and an organic light-emitting display device (OLED).

The organic light-emitting display device (OLED) is self-luminous, and has a superior viewing angle and a superior contrast ratio, compared to the liquid crystal display device (LCD). The OLED does not need a separate backlight and is lightweight and thin and has lower power consumption.

As use of a personal information device increases, marketability of a privacy film or a security film for digital privacy protection and personal information protection is increasing. In general, the security film is fixedly attached on a front face of a display panel so that an image may be selectively viewed according to a viewing angle.

In the conventional scheme for digital privacy and personal information protection, a user may selectively attach a privacy film on a front face of the display panel and thus may switch a normal mode (wide viewing angle mode) to a privacy mode (narrow viewing angle mode). When the user want to switch from the privacy mode to the normal mode again, the privacy film must be detached. This conventional scheme is inconvenient because it requires a process of attaching and detaching the privacy film according to the mode switching.

SUMMARY

Accordingly, the present disclosure is to provide a new structure of an organic light-emitting display device that can easily and quickly switch a viewing angle of a display screen according to the user's convenience and environment without using the privacy film.

Thus, the present disclosure is to provide an organic light-emitting display device including a viewing angle control layer capable of controlling a viewing angle according to the user's choice.

Further, the present disclosure is to provide an organic light-emitting display device capable of suppressing visibility of reflected light as well as controlling the viewing angle.

The present disclosure is not limited to the above-mentioned features. Other features and advantages according to the present disclosure that are not mentioned may be understood based on following descriptions, and may be more clearly understood based on aspects according to the present disclosure. Further, it will be easily understood that the purposes and advantages according to the present disclosure may be realized using means shown in the claims and combinations thereof.

An organic light-emitting display device according to one aspect of the present disclosure comprises a viewing angle control layer including a liquid crystal layer disposed on a second electrode of an organic light-emitting element and a control electrode disposed on the liquid crystal layer. In this connection, the control electrode includes a plate electrode and a plurality of tip electrodes protruding from the plate electrode toward the second electrode, wherein the plurality of tip electrodes are arranged within a light-emitting area of the organic light-emitting element. Further, the liquid crystal layer includes positive c-plate liquid crystal molecules aligned vertically.

The organic light-emitting display device according to one aspect of the present disclosure applies or does not apply a voltage to the control electrode to actively control the viewing angle.

According to the present disclosure, actively controlling whether a voltage is applied to the control electrode including the plurality of tip electrodes disposed within the light-emitting area of the organic light-emitting element may allow the viewing angle to be switched from a normal mode (wide viewing angle mode) to a privacy mode (narrow viewing angle mode), or from the privacy mode to the normal mode.

According to the present disclosure, the device comprises the liquid crystal layer including vertically aligned positive c-plate liquid crystal molecules and a $\lambda/4$ phase retardation layer disposed thereon, such that the visibility of the reflected light according to the viewing angle may be suppressed.

Effects of the present disclosure are not limited to the above-mentioned effects, and other effects as not mentioned will be clearly understood by those skilled in the art from following descriptions.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
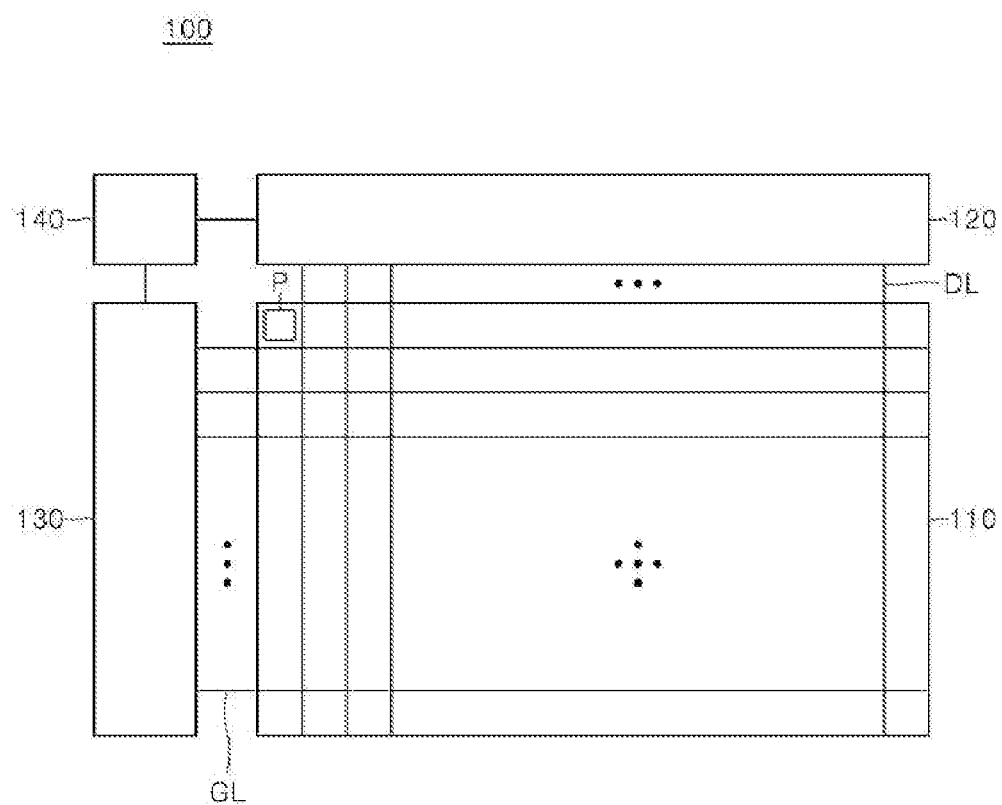
FIG. 1 is a block diagram schematically illustrating an organic light-emitting display device.

Advantages and features of the present disclosure, and a method of achieving the Advantages and features will become apparent with reference to aspects described later in detail together with the accompanying drawings. However, the present disclosure is not limited to the aspects as disclosed below, but may be implemented in various different forms. Thus, these aspects are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the aspects of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular aspects only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an organic light-emitting display device according to some aspects of the present disclosure will be described.

Figure 2:
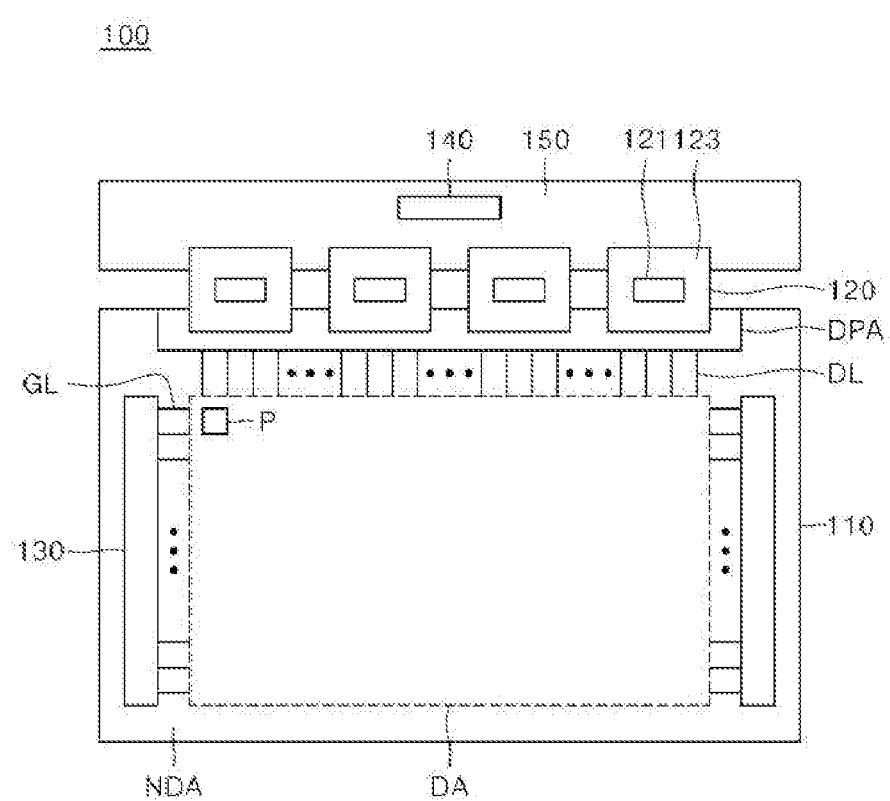
FIG. 2 is a plan view schematically illustrating connections and an arrangement relationship of components constituting an organic light-emitting display device.

FIG. 1 is a block diagram schematically illustrating an organic light-emitting display device. FIG. 2 is a plan view schematically illustrating connections and an arrangement relationship of components constituting an organic light-emitting display device. However, FIGS. 1 and 2 are exemplary aspects of the present disclosure. The connections and the arrangement relationship of the components of an organic light-emitting display device 100 according to the present disclosure are not limited thereto.

The organic light-emitting display device 100 may include a display panel 110, a timing controller 140, a data driver 120, and a gate driver 130.

The display panel 110 may include a display area DA that includes a pixel P array to display an image, and a non-display area NDA that does not display an image.

The non-display area NDA may be disposed to surround the display area DA. In the non-display area NDA, the gate driver 130, a data drive IC pad area DPA and various lines may be disposed. The non-display area NDA may correspond to a bezel area.

The display panel 110 may include a plurality of pixel areas defined by a plurality of gate lines GL extending in one direction, and a plurality of data lines DL extending in a direction to be orthogonal to the gate lines GL.

The pixel areas may be arranged in a matrix form. A pixel P including a plurality of sub-pixels SP may be disposed in each pixel area.

The gate driver 130 controls on/off of a driving thin-film transistor 210 of each of the pixels in response to a gate control signal applied from the timing controller 140, and allows a data voltage Vdata applied from the data driver 120 to be provided to an appropriate pixel circuit. To this end, the gate driver 130 sequentially outputs gate signals such as a scan signal or a light-emitting signal and sequentially supplies the gate signals to the gate lines GL.

When the gate signals are supplied to the gate line GL, the data voltage may be applied to sub-pixels of pixel circuits connected to a specific gate line GL.

The gate driver 130 may include at least one gate driver integrated circuit (IC) and may be located on one side or both sides of the display panel 110 according to a driving scheme or a design scheme of the display panel 110.

As shown in FIG. 2, the gate driver 130 may be embodied in a GIP (Gate driver In Panel) scheme so that a gate driver integrated circuit may be formed directly on the display panel 110. The gate driver 130 in the GIP scheme may be disposed in the non-display area NDA on each of both left and right sides of the display area DA. Further, the gate driver integrated circuit may be connected to a bonding pad of the display panel 110 in a TAB (Tape Automated Bonding) scheme or a COG (chip-on-glass) scheme, or may be implemented in a COF (chip-on film) scheme.

The data driver 120 converts the image data received from the timing controller 140 into an analog data voltage when a specific gate line GL is opened. In synchronization with the gate control signal, the data driver 120 supplies the converted data voltage to the data line DL.

The data driver 120 may include at least one source driver integrated circuit 121 to drive a plurality of data lines DL. Each source driver integrated circuit 121 may be connected to the bonding pad of the display panel 110 in the TAB scheme or the COG scheme, or may be directly disposed on or integrated onto the display panel 110. Further, each source driver integrated circuit 121 may be implemented in the COF scheme. For example, as shown in FIG. 2, each source driver integrated circuit 121 may be mounted on a flexible film 123, and then, one end of the flexible film 123 may be bonded to at least one control printed circuit board 150, while the other end thereof may be bonded to the data drive IC pad area DPA of the display panel 110.

Therefore, lines connecting the data drive IC pad area DPA of the display panel 110 and the source driver integrated circuit 121 to each other, and lines connecting the data drive IC pad area DPA with lines of the control printed circuit board 150 may be formed on the flexible film 123.

A number of circuits implemented as driving chips may be mounted on the control printed circuit board 150. For example, the timing controller 140 may be disposed thereon as shown in FIG. 2. Further, a power controller for supplying various voltages or currents to the display panel 110, the data driver 120 and the gate driver 130, or controlling various voltages or currents to be supplied may be further disposed on the control printed circuit board 150.

The timing controller 140 provides a gate control signal to the gate driver 130 and provides a data control signal to the data driver 120, such that the data driver 120 and the gate driver 130 are controlled.

Further, the timing controller 140 starts a scanning operation according to a timing implemented in each frame, and converts input image data input from an outside according to a data signal format used by the data driver 120, and outputs the converted image data, and controls data operation at an appropriate time according to the scanning operation.

Hereinafter, a display device according to one aspect of the present disclosure will be described in more detail with reference to FIG. 3.

Figure 3:
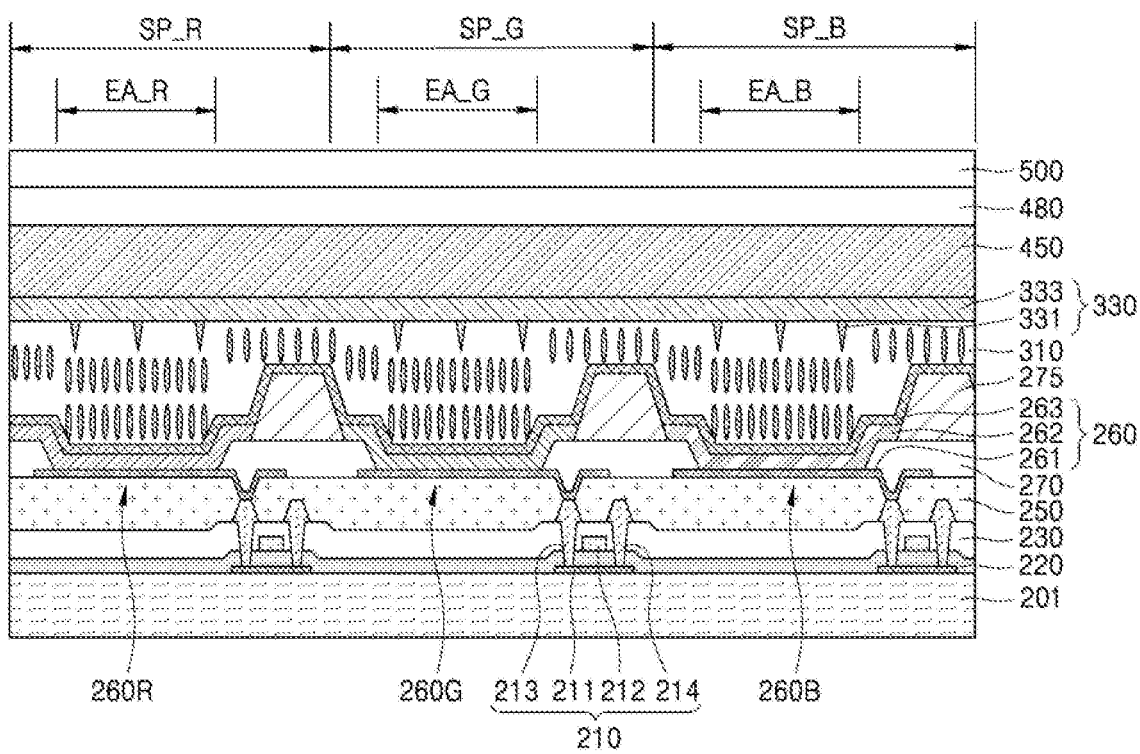
FIG. 3 is a schematic cross-sectional view of an organic light-emitting display device according to one aspect of the present disclosure.

FIG. 3 is a schematic cross-sectional view of an organic light-emitting display device according to one aspect of the present disclosure.

Referring to FIG. 3, the display area DA of the organic light-emitting display device 100 may include, for example, three sub-pixel areas. The display area DA of the organic light-emitting display device 100 may include for example, a red sub-pixel area SP_R, a green sub-pixel area SP_G, and a blue sub-pixel area SP_B. The display area DA of the organic light-emitting display device 100 may include a first substrate 201 and a second substrate 450. On the first substrate 201 of the display area DA of the organic light-emitting display device 100, a thin-film transistor layer, an organic light-emitting element layer, and a viewing angle control layer may be formed. A phase retardation layer and a polarization layer may be formed on the second substrate 450.

The thin-film transistor layer includes a thin-film transistor 210, a gate insulating layer 220, an interlayer insulating layer 230, and a planarization layer 250.

The first substrate 201 may be embodied as a glass substrate or a plastic substrate. The first substrate 201 may include three sub-pixel areas, for example, a red sub-pixel area SP_R, a green sub-pixel area SP_G, and a blue sub-pixel area SP_B. The thin-film transistor 210 may be formed in each sub-pixel area.

A buffer layer may be formed on one face of the first substrate 201. The buffer layer is formed on one face of the first substrate 201 to protect the thin-film transistor 210 and the organic light-emitting element 260 from moisture passing through the first substrate 201 vulnerable to moisture permeation. The buffer layer may be composed of a plurality of inorganic layers as stacked alternately. For example, the buffer layer may be composed of multiple layers in which at least one inorganic film among a silicon oxide film $SiO_x$, a silicon nitride film $SiN_x$, and a SiON film is alternately stacked.

The thin-film transistor 210 is formed on the buffer layer. The thin-film transistor 210 includes an active layer 211, a gate electrode 212, a source electrode 213 and a drain electrode 214. In the present disclosure, it is illustrated that the thin-film transistor 210 is of a top gate type in which the gate electrode 212 is located above the active layer 211. The present disclosure is not limited thereto. The thin-film transistor 210 may be of a bottom gate type or a double gate type.

The active layer 211 is formed on the buffer layer. The active layer 211 may be made of an oxide semiconductor material such as IGZO (Indium Gallium Zinc Oxide), but is not limited thereto. Alternatively, the active layer 211 may be made of low temperature polycrystalline silicon (LTPS) or amorphous silicon (a-Si).

A light-blocking layer may be formed between the buffer layer and the active layer 211 to prevent external light from being incident on the active layer 211.

On the active layer 211, the gate insulating layer 220 that may insulate the active layer 211 and the gate electrode 212 from each other may be formed. In the present disclosure, it is illustrated that the gate insulating layer 220 is formed over an entire first substrate 111. The present disclosure is not limited thereto. The gate insulating layer 220 may only be formed under the gate electrode 212. The gate insulating layer 220 may be composed of an inorganic material layer, for example, a silicon oxide film $SiO_x$, a silicon nitride film $SiN_x$, or multiple layers thereof.

The gate electrode 212 and a gate line may be formed on the gate insulating layer 220. Each of the gate electrode 212 and the gate line may be composed of a single layer or multiple layers, made of one of molybdenum (Mo), aluminum (Al), chromium (Cr), gold (Au), titanium (Ti), nickel (Ni), neodymium (Nd) and copper (Cu), or an alloy thereof.

The interlayer insulating layer 230 may be formed on the gate electrode 212 and the gate line. The interlayer insulating layer 230 may be composed of an inorganic film, for example, a silicon oxide film $SiO_x$, a silicon nitride film $SiN_x$, or multiple layers thereof.

The source electrode 213, the drain electrode 214, and the data line may be formed on the interlayer insulating layer 230. Each of the source electrode 213 and the drain electrode 214 may be connected to the active layer 211 via each contact hole extending through the gate insulating layer 220 and the interlayer insulating layer 230. Each of the source electrode 213, the drain electrode 214 and the data line may be composed of a single layer or multiple layers, made of one of molybdenum (Mo), aluminum (Al), chromium (Cr), gold (Au), titanium (Ti), nickel (Ni), neodymium (Nd) and copper (Cu), or an alloy thereof.

The planarization layer 250 that may remove a step due to the thin-film transistor 210 may be formed on the source electrode 213, the drain electrode 214 and the data line. The planarization layer 250 may be composed of an organic film made of acrylic resin, epoxy resin, phenolic resin, polyamide resin, or polyimide resin.

On the thin-film transistor layer, an organic light-emitting element layer is formed. The organic light-emitting element layer includes organic light-emitting elements 260, each formed per a sub-pixel area, and a bank layer 270 that defines the organic light-emitting elements 260.

The organic light-emitting elements 260, may include, for example, a red organic light-emitting element 260R formed in the red sub-pixel area SP_R, a green organic light-emitting element 260G formed in the green sub-pixel area SP_G, and a blue organic light-emitting element 260B formed in the blue sub-pixel area SP_B.

The organic light-emitting element 260 and the bank layer 270 are formed on the planarization layer 250. The organic light-emitting element 260 includes a first electrode 261, an organic light-emitting layer 262 and a second electrode 263.

The first electrode 261 may act as an anode, while the second electrode 263 may act as a cathode.

The first electrode 261 may be formed on the planarization layer 250. The first electrode 261 is connected to the source electrode 213 of the thin-film transistor 210 via a contact hole extending through the planarization layer 250. The first electrode 261 may be made of a metal material with high reflectance. For example, the first electrode 261 may be composed of a stack structure of aluminum and titanium (Ti/Al/Ti), a stack structure of aluminum and ITO (ITO/Al/ITO), an APC alloy, or a stack structure of an APC alloy and ITO (ITO/APC/ITO). In this connection, the APC alloy refers to an alloy of silver (Ag), palladium (Pd), and copper (Cu).

The bank layer 270 may be formed on the planarization layer 250 so as to cover an edge of the first electrode 261 to partition sub-pixels. That is, the bank layer 270 serves as a pixel defining film that defines the sub-pixels. Specifically, the bank layer 270 may have a plurality of openings defined therein. The opening may correspond to a light-emitting area of the organic light-emitting element 260. The light-emitting areas may include a red light-emitting area EA_R formed in the red sub-pixel area SP_R, a green light-emitting area EA_G formed in the green sub-pixel area SP_G, and the blue light-emitting area EA_B formed in the blue sub-pixel area SP_B.

The bank layer 270 may be composed of an organic film made of acrylic resin, epoxy resin, phenolic resin, polyamide resin, or polyimide resin.

On the bank layer 270, a spacer layer 275 may be formed which provides a space into which the liquid crystal layer 310 is be injected on the light-emitting areas of the organic light-emitting elements 260, and which maintains a constant gap.

The organic light-emitting layer 262 is formed on the first electrode 261. The organic light-emitting layer 262 may include a hole transporting layer, a hole transporting layer, at least one light-emitting layer, and an electron transporting layer. In this case, when the voltage is applied across the first electrode 261 and the second electrode 263, holes and electrons move to the light-emitting layer via the hole transport layer and the electron transport layer, respectively, and are then combined with each other in the light-emitting layer to emit light.

The organic light-emitting layer 262 may include a red light-emitting layer that emits red light as formed in the red sub-pixel area SP_R, a green light-emitting layer that emits green light as formed in the green sub-pixel area SP_G, or a blue light-emitting layer that emits blue light as formed in the blue sub-pixel area SP_B. In this case, the organic light-emitting layer 262 may be formed in an area corresponding to the first electrode 261.

The second electrode 263 is formed on the spacer layer 275 and the organic light-emitting layer 262. When the display device 100 has a top emission structure, the second electrode 263 may be made of a transparent conductive material (TCO) such as ITO or IZO that may transmit light therethrough, or a semi-transmissive conductive material such as magnesium (Mg), silver (Ag), or an alloy of magnesium (Mg) and silver (Ag).

A viewing angle control layer is formed on the organic light-emitting element layer. The viewing angle control layer includes the liquid crystal layer 310 and a control electrode 330. The control electrode 330 may be opposite to the second electrode 263 of the organic light-emitting elements 260. The liquid crystal layer 310 may be disposed between the second electrode 263 and the control electrode 330.

The control electrode 330 includes a plate electrode 333 disposed to correspond to the second electrode 263 and a plurality of tip electrodes 331 protruding from the plate electrode 333 toward the second electrode 263, wherein the plurality of tip electrodes 331 are disposed within each of light-emitting areas EA_R, EA_G, or EA_B.

The control electrode 330 may be made of transparent conductive oxide (TCO) such as $SnO_2$, ZnO, ITO, and IZO that may transmit light therethrough.

The liquid crystal layer 310 may include positive c-plate liquid crystal molecules aligned vertically between the second electrode 263 and the control electrode 330 in the normal mode in which the viewing angle control layer is not activated, i.e. in which a voltage is not applied to the control electrode 330.

Figure 4:
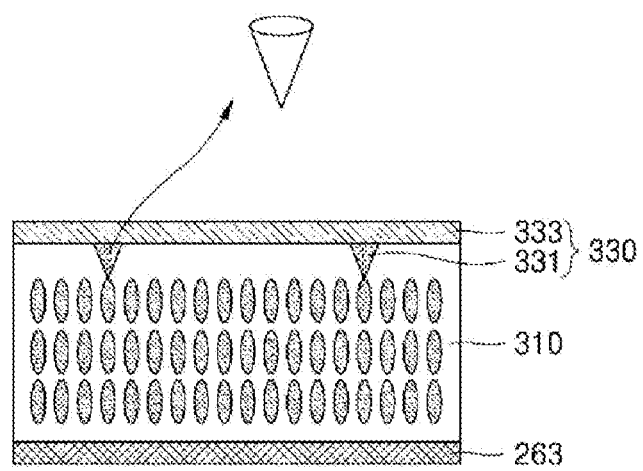
FIG. 4 is a schematic cross-sectional view showing an off state (normal mode) in which a viewing angle control layer of an organic light-emitting display device according to one aspect of the present disclosure is not activated.
Figure 6:
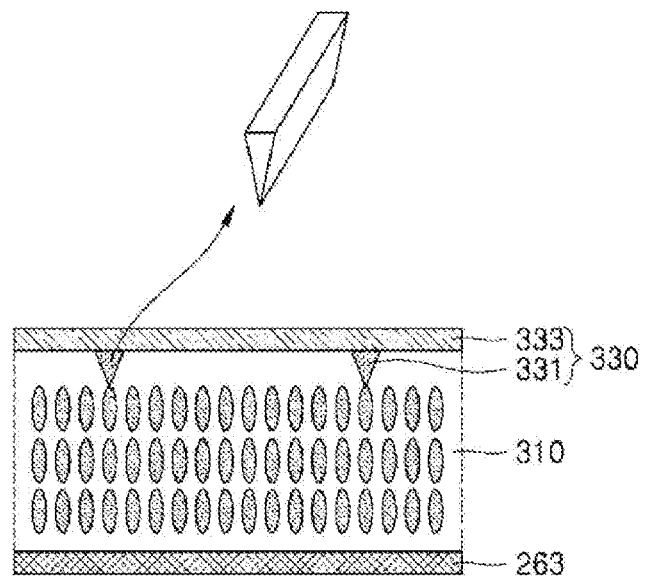
FIG. 6 is a schematic cross-sectional view showing an off-off state (normal mode) in which a viewing angle control layer of an organic light-emitting display device according to another aspect of the present disclosure is deactivated.

Referring to FIGS. 4 and 6, the liquid crystal layer 310 may act as a single refractive index area in the normal mode when no voltage is applied to the control electrode 330.

Figure 5:
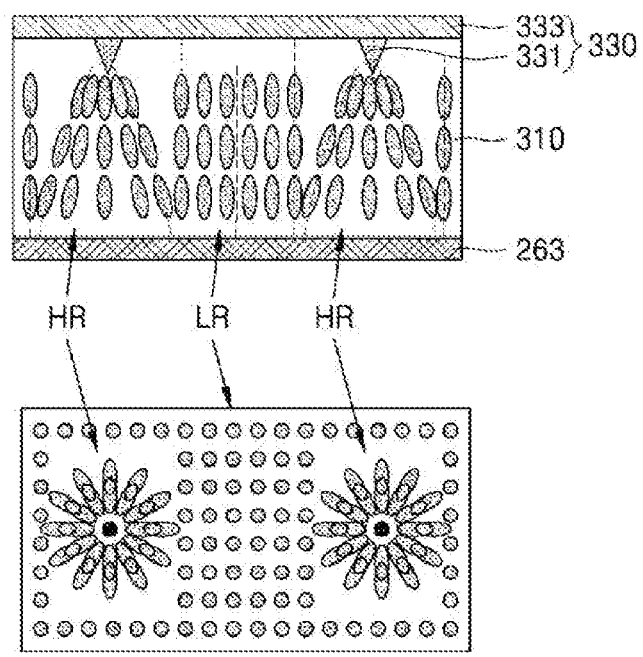
FIG. 5 is a schematic cross-sectional and plan view showing an on-state (privacy mode) in which an viewing angle control layer of an organic light-emitting display device according to one aspect of the present disclosure is activated.
Figure 7:
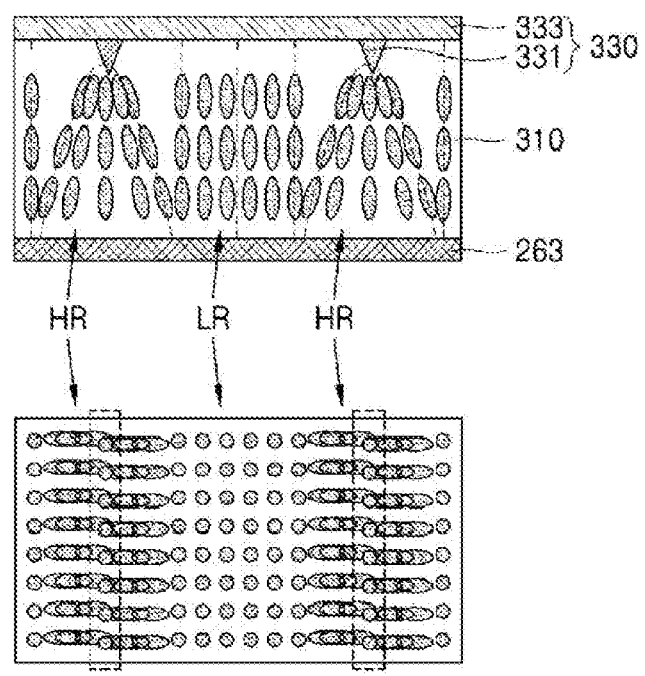
FIG. 7 is a schematic cross-sectional and a plan view showing an on-state (privacy mode) in which a viewing angle control layer of an organic light-emitting display device according to another aspect of the present disclosure is activated.

In one example, referring to FIGS. 5 and 7, in the privacy mode when a voltage is applied to the control electrode 330, the liquid crystal layer 310 may include a plurality of high refractive index areas HR corresponding to the plurality of tip electrodes 331, and at least one low refractive index area LR disposed around each of the plurality of high refractive index areas HR. Depending on a shape and an arrangement of the tip electrodes 331, one low refractive index area LR surrounds a plurality of high refractive index areas HR, as shown in FIG. 5, or, as shown in FIG. 7, the high refractive index areas HR and the low refractive index areas LR may be alternately arranged with each other.

When the voltage is applied to the control electrode 330, an electric field is concentrated around the tip electrode 331. Accordingly, liquid crystal molecules adjacent to the tip electrode 331 are densely aligned along the electric field to form the high refractive index area HR. A uniform electric field is generated in an area between the tip electrodes 331, so that the liquid crystal molecules maintain an existing alignment thereof and thus the low refractive index area LR is maintained. In the present disclosure, the high refractive index area HR and low refractive index area LR are relative concepts.

The light emitted from the organic light-emitting element 260 may be condensed toward a front direction of the organic light-emitting display device 100 due to a difference between a refractive index of the high refractive index area HR and refractive index of the low refractive index area LR. Therefore, the viewing angle of the organic light-emitting display device 100 may be narrow.

Figure 8:
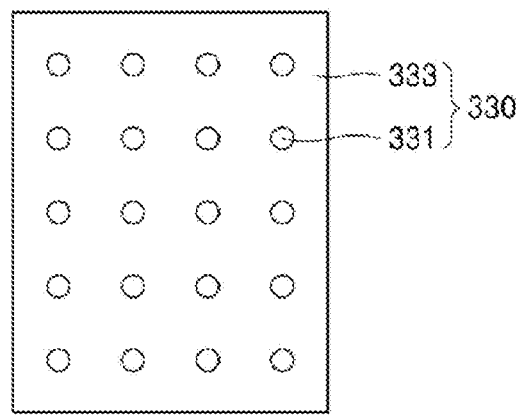
FIG. 8 to FIG. 11 are plan views showing an arrangement of tip electrodes of a control electrode according to an aspect of the present disclosure.

Each of the plurality of tip electrodes 331 may have a conical shape as shown in FIG. 4. Alternatively, each of the plurality of tip electrodes 331 may have a polygonal pyramid shape such as a triangular pyramid, a rectangular pyramid, and a pentagonal pyramid. In this case, as shown in FIG. 8, the plurality of tip electrodes 331 may be arranged and spaced from each other by the same spacing, in each light-emitting area, and in a first direction (in an up-down (vertical) direction on drawing) and in a second direction perpendicular to the first direction (in a left and right (horizontal) direction on the drawing). In an aspect of FIG. 8 in which the plurality of tip electrodes 331 are arranged and spaced from each other by the same spacing, in a privacy mode in which a voltage is applied to the control electrode 330, one low refractive index area LR surrounds the plurality of high refractive index areas HR arranged and spaced from each other by the same spacing in the vertical direction and in the horizontal direction as shown in FIG. 5. In this case, the organic light-emitting display device 100 may implement a narrow viewing angle in the up-down (vertical) and left and right (horizontal) directions in the privacy mode.

Figure 9:
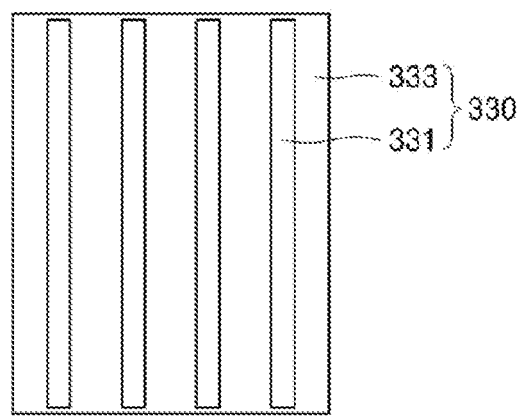

Each of the plurality of tip electrodes 331 may have a wedge shape as shown in FIG. 6. In this case, as shown in FIG. 9, the plurality of tip electrodes 331 may have a wedge shape extending over the entire light-emitting area in the first direction (the up-down (vertical) direction on the drawing) within each light-emitting area, and may be arranged and spaced from each other, in the second direction (the left and right (horizontal) direction on the drawing) perpendicular to the first direction, by an equal spacing. When the plurality of tip electrodes 331 are arranged as shown in FIG. 9, in a privacy mode in which a voltage is applied to the control electrode 330, one of a plurality of low refractive index areas LR is disposed between adjacent ones of the plurality of high refractive index areas HR arranged and spaced from each other by the same spacing in the left and right (horizontal) direction as shown in FIG. 7. That is, each of the plurality of high refractive index areas HR and each of the plurality of low refractive index areas LR are alternately arranged with each other in the left and right (horizontal) direction. In this case, the organic light-emitting display device 100 may implement a narrow viewing angle in the left and right (horizontal) direction in the privacy mode.

Figure 10:
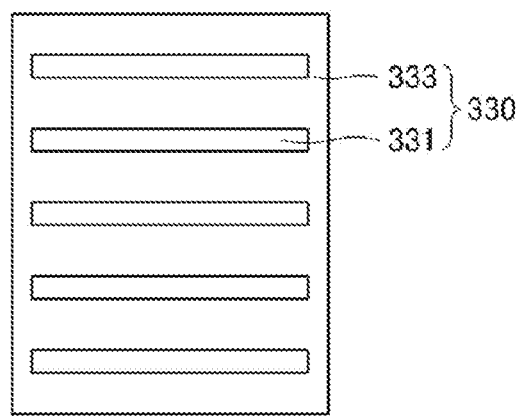

When each of the plurality of tip electrodes 331 has a wedge shape, the plurality of tip electrodes 331 may have a wedge shape extending over the entire light-emitting area in the second direction (the left and right (horizontal) direction on the drawing) within each light-emitting area, and may be arranged and spaced from each other, in the first direction (the up-down (vertical) direction on the drawing) perpendicular to the first direction, by an equal spacing, as shown in FIG. 10.

When the plurality of tip electrodes 331 are arranged as shown in FIG. 10, in a privacy mode in which a voltage is applied to the control electrode 330, one of a plurality of low refractive index areas LR is disposed between adjacent ones of the plurality of high refractive index areas HR arranged and spaced from each other by the same spacing in the up-down (vertical) direction. That is, each of the plurality of high refractive index areas HR and each of the plurality of low refractive index areas LR are alternately arranged with each other in the up-down (vertical) direction. In this case, the organic light-emitting display device 100 may implement a narrow viewing angle in the up-down (vertical) direction in the privacy mode.

Figure 11:
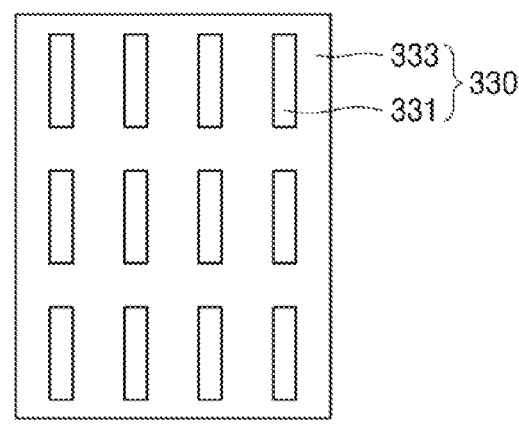

When each of the plurality of tip electrodes 331 has a wedge shape, the plurality of tip electrodes 331 may have a wedge shape extending in the first direction (the up-down (vertical) direction on the drawing) within each light-emitting area, and may be arranged and spaced from each other, in the first direction by a first spacing, and in the second direction (the left and right (horizontal) direction on the drawing) perpendicular to the first direction, by a second spacing, as shown in FIG. 11.

When the plurality of tip electrodes 331 are arranged as shown in FIG. 11, in a privacy mode in which a voltage is applied to the control electrode 330, one low refractive index area LR surrounds a plurality of high refractive index areas HR arranged and spaced from each other by the same spacing in the up-down (vertical) and left and right (horizontal) directions. In this case, the organic light-emitting display device 100 may implement a narrow viewing angle in the up-down (vertical) and left and right (horizontal) directions in the privacy mode.

Referring back to FIG. 3, the second substrate 450 may be disposed on the control electrode 330. The second substrate 450 may be embodied as a glass substrate, a plastic substrate, or an encapsulating film (protective film).

A λ/4 phase retardation layer 480 and a polarization layer 500 to suppress visibility of reflection of external light may be sequentially stacked in this order on the second substrate 450.

The λ/4 phase retardation layer 480 may be made of acryl based polymer, polycarbonate based polymer, polystyrene based polymer, polyimide based polymer, cellulose based polymer, olefin based polymer, cycloolefin polymer, or a mixture thereof.

The polarization layer 500 may be formed by dying a polyvinyl alcohol (PVA) film with iodine or dichroic dye, and stretching the film in one direction.

The second substrate 450 and the λ/4 phase retardation layer 480 may be adhered to each other via a conventional adhesive. The λ/4 phase retardation layer 480 and the polarizing layer 500 may be adhered to each other via a conventional adhesive. For example, the adhesive may include a polyvinyl alcohol-based adhesive, but is not limited thereto.

Since a thickness directional phase difference Rth due to the vertically aligned liquid crystal molecules in the liquid crystal layer 310 may be cancelled with a thickness directional phase difference Rth of the λ/4 phase retardation layer 480, the visibility of the reflected light according to the viewing angle may be suppressed.

Aspects of the present disclosure may be described as follows.

A first aspect of the present disclosure provides an organic light-emitting display device comprising: a first electrode disposed on a substrate; a bank covering an edge of the first electrode and defining a light-emitting area; an organic light-emitting layer disposed in a light-emitting area; a second electrode disposed on the organic light-emitting layer; and a viewing angle control layer including: a liquid crystal layer disposed on the second electrode; and a control electrode disposed on the liquid crystal layer, wherein the control electrode includes a plate electrode, and a plurality of tip electrodes protruding from the plate electrode toward the second electrode, wherein the plurality of tip electrodes are disposed in the light-emitting area.

In one implementation of the first aspect, the liquid crystal layer includes positive c-plate liquid crystal molecules aligned vertically.

In one implementation of the first aspect, each of the plurality of tip electrodes has a conical shape or a polygonal pyramid shape, wherein the plurality of tip electrodes are arranged and spaced from each other by the same spacing in a first direction and a second direction perpendicular to the first direction, in the light-emitting area.

In one implementation of the first aspect, each of the plurality of tip electrodes has a wedge shape extending across an entirety of the light-emitting area in a first direction, wherein the plurality of tip electrodes are arranged and spaced from each other by the same spacing in a second direction perpendicular to the first direction, in the light-emitting area.

In one implementation of the first aspect, each of the plurality of tip electrodes has a wedge shape extending in a first direction, wherein the plurality of tip electrodes are arranged and spaced from each other by a first spacing in a first direction, and by a second spacing in a second direction perpendicular to the first direction, in the light-emitting area.

In one implementation of the first aspect, when a voltage is applied to the control electrode, the liquid crystal layer includes a plurality of high refractive index areas respectively corresponding to the plurality of tip electrodes, and at least one low refractive index area disposed around the plurality of high refractive index areas.

In one implementation of the first aspect, the device further comprises a λ/4 phase retardation layer and a polarization layer sequentially stacked in this order on the control electrode.

A second aspect of the present disclosure provides an organic light-emitting display device comprising: a substrate including a plurality of sub-pixel areas; a plurality of organic light-emitting elements respectively disposed in the plurality of sub-pixel areas; a control electrode opposite to a cathode of each of the plurality of organic light-emitting elements; and a liquid crystal layer disposed between the cathode and the control electrode, wherein the control electrode includes a plate electrode, and a plurality of tip electrodes protruding from the plate electrode toward the cathode, wherein the plurality of tip electrodes are repetitively arranged in each of a plurality of portions of the plate electrode respectively overlapping the plurality of organic light-emitting elements.

In one implementation of the second aspect, the liquid crystal layer includes positive c-plate liquid crystal molecules aligned vertically.

In one implementation of the second aspect, each of the plurality of tip electrodes has a conical shape or a polygonal pyramid shape, wherein the plurality of tip electrodes are arranged and spaced from each other by the same spacing in a first direction and a second direction perpendicular to the first direction, in a light-emitting area of each of the plurality of organic light-emitting elements.

In one implementation of the second aspect, each of the plurality of tip electrodes has a wedge shape extending across an entirety of a light-emitting area of each of the plurality of organic light-emitting elements in a first direction, wherein the plurality of tip electrodes are arranged and spaced from each other by the same spacing in a second direction perpendicular to the first direction, in each light-emitting area.

In one implementation of the second aspect, each of the plurality of tip electrodes has a wedge shape extending in a first direction, wherein the plurality of tip electrodes are arranged and spaced from each other by a first spacing in a first direction, and by a second spacing in a second direction perpendicular to the first direction, in a light-emitting area of each of the plurality of organic light-emitting elements.

In one implementation of the second aspect, when a voltage is applied to the control electrode, the liquid crystal layer includes a plurality of high refractive index areas respectively corresponding to the plurality of tip electrodes, and at least one low refractive index area disposed around the plurality of high refractive index areas.

In one implementation of the second aspect, the device further comprises a λ/4 phase retardation layer and a polarization layer sequentially stacked in this order on the control electrode.

Although the aspects of the present disclosure have been described in more detail with reference to the accompanying drawings, the present disclosure is not necessarily limited to these aspects. The present disclosure may be implemented in various modified manners within the scope not departing from the technical idea of the present disclosure. Accordingly, the aspects disclosed in the present disclosure are not intended to limit the technical idea of the present disclosure, but to describe the present disclosure. The scope of the technical idea of the present disclosure is not limited by the aspects. Therefore, it should be understood that the aspects as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. An organic light-emitting display device comprising:
a first electrode disposed on a substrate;
a bank covering an edge of the first electrode and defining a light-emitting area;
an organic light-emitting layer disposed in a light-emitting area;
a second electrode disposed on the organic light-emitting layer; and
a viewing angle control layer including:
  a liquid crystal layer disposed on the second electrode; and
  a control electrode disposed on the liquid crystal layer, wherein the control electrode includes a plate electrode and a plurality of tip electrodes protruding from the plate electrode toward the second electrode, and
  wherein the plurality of tip electrodes are arranged in the light-emitting area, and
  wherein an electric field is formed between the second electrode and the control electrode by the voltage applied to the control electrode.

2. The device of claim 1, wherein the liquid crystal layer includes positive c-plate liquid crystal molecules aligned vertically.

3. The device of claim 1, wherein each of the plurality of tip electrodes has a conical shape or a polygonal pyramid shape, and
wherein the plurality of tip electrodes are spaced from one another by a same spacing in a first direction and a second direction perpendicular to the first direction, in the light-emitting area.

4. The device of claim 1, wherein each of the plurality of tip electrodes has a wedge shape extended across an entirety of the light-emitting area in a first direction, and
wherein the plurality of tip electrodes are arranged and spaced from each other by the same spacing in a second direction perpendicular to the first direction, in the light-emitting area.

5. The device of claim 1, wherein each of the plurality of tip electrodes has a wedge shape extended in a first direction, and
wherein the plurality of tip electrodes are spaced from one another by a first spacing in a first direction and by a second spacing in a second direction perpendicular to the first direction, in the light-emitting area.

6. The device of claim 1, wherein, when a voltage is applied to the control electrode, the liquid crystal layer includes a plurality of high refractive index areas respectively corresponding to the plurality of tip electrodes, and at least one low refractive index area is disposed around the plurality of high refractive index areas.

7. The device of claim 1, further comprising a λ/4 phase retardation layer and a polarization layer sequentially stacked in this order on the control electrode.

8. An organic light-emitting display device comprising:
a substrate including a plurality of sub-pixel areas;
a plurality of organic light-emitting elements respectively disposed in the plurality of sub-pixel areas;
a control electrode opposite to a cathode of each of the plurality of organic light-emitting elements; and
a liquid crystal layer disposed between the cathode and the control electrode,
wherein the control electrode includes a plate electrode and a plurality of tip electrodes protruding from the plate electrode toward the cathode, and
wherein the plurality of tip electrodes are repetitively arranged in each of a plurality of portions of the plate electrode respectively overlapping with the plurality of organic light-emitting elements, and
wherein an electric field is formed between the cathode and the control electrode by the voltage applied to the control electrode.

9. The device of claim 8, wherein the liquid crystal layer includes positive c-plate liquid crystal molecules aligned vertically.

10. The device of claim 8, wherein each of the plurality of tip electrodes has a conical shape or a polygonal pyramid shape, and
wherein the plurality of tip electrodes are spaced from one another by a same spacing in a first direction and a second direction perpendicular to the first direction, in a light-emitting area of each of the plurality of organic light-emitting elements.

11. The device of claim 8, wherein each of the plurality of tip electrodes has a wedge shape extending across an entirety of a light-emitting area of each of the plurality of organic light-emitting elements in a first direction, and
wherein the plurality of tip electrodes are spaced from one another by a same spacing in a second direction perpendicular to the first direction, in each light-emitting area.

12. The device of claim 8, wherein each of the plurality of tip electrodes has a wedge shape extending in a first direction, and
wherein the plurality of tip electrodes are spaced from one another by a first spacing in a first direction and by a second spacing in a second direction perpendicular to the first direction, in a light-emitting area of each of the plurality of organic light-emitting elements.

13. The device of claim 8, wherein, when a voltage is applied to the control electrode, the liquid crystal layer includes a plurality of high refractive index areas respectively corresponding to the plurality of tip electrodes, and at least one low refractive index area is disposed around the plurality of high refractive index areas.

14. The device of claim 8, further comprising a λ/4 phase retardation layer and a polarization layer sequentially stacked in this order on the control electrode.

15. An organic light-emitting display device comprising:
a plurality of organic light-emitting elements respectively disposed in a plurality of light-emitting areas;
a plate electrode facing a cathode of the plurality of organic light-emitting elements;
a plurality of tip electrodes protruding from the plate electrode and disposed in the plurality of light-emitting areas and each tip electrode having a shape to generate a plurality of high refractive index areas in close proximity of the plurality of tip electrodes and at least one low refractive index area around the plurality of high refractive index areas when an electric field is formed between the cathode and the plurality of tip electrodes by the voltage applied to the plurality of tip electrodes; and a liquid crystal layer disposed between the cathode and the plurality of tip electrodes.

16. The device of claim 15, wherein the liquid crystal layer includes positive c-plate liquid crystal molecules aligned vertically.

17. The device of claim 15, wherein the plurality of tip electrodes has a conical shape or a polygonal pyramid shape extended in the first and second directions.

18. The device of claim 15, wherein the plurality of tip electrodes has a wedge shape extended in the first direction.

19. The device of claim 15, further comprising a $\lambda/4$ phase retardation layer disposed on the plate electrode.

20. The device of claim 19, further comprising a polarization layer disposed on the $\lambda/4$ phase retardation layer.

* * * * *